(12) United States Patent
Moest et al.

(10) Patent No.: US 9,857,694 B2
(45) Date of Patent: Jan. 2, 2018

(54) ESTIMATING DEFORMATION OF A PATTERNING DEVICE AND/OR A CHANGE IN ITS POSITION

(71) Applicants: ASML Netherlands B.V., Veldhoven (NL); ASML Holding N.V., Veldhoven (NL)

(72) Inventors: Bearrach Moest, Eindhoven (NL); Peter A. Delmastro, New Milford, CT (US); Johannes Onvlee, 's Hertogenbosch (NL); Adrianus Martinus Van Der Wielen, Eindhoven (NL); Christopher Charles Ward, Kensington, CA (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 15/122,772

(22) PCT Filed: Mar. 5, 2015

(86) PCT No.: PCT/EP2015/054650
§ 371 (c)(1),
(2) Date: Aug. 31, 2016

(87) PCT Pub. No.: WO2015/165623
PCT Pub. Date: Nov. 5, 2015

(65) Prior Publication Data
US 2017/0068171 A1    Mar. 9, 2017

Related U.S. Application Data

(60) Provisional application No. 61/985,222, filed on Apr. 28, 2014.

(51) Int. Cl.
    *G03B 27/68*      (2006.01)
    *G03B 27/52*      (2006.01)
    (Continued)

(52) U.S. Cl.
    CPC .......... *G03F 7/70616* (2013.01); *G01B 11/14* (2013.01); *G03F 7/70058* (2013.01);
    (Continued)

(58) Field of Classification Search
    CPC ............. G03F 7/70616; G03F 7/70058; G03F 7/70258; G03F 7/70875
    (Continued)

(56) References Cited

U.S. PATENT DOCUMENTS 5,581,324 A * 12/1996 Miyai ................. G03F 7/70258
    355/53
5,646,413 A * 7/1997 Nishi ................... G03F 7/70358
    250/548

(Continued)

FOREIGN PATENT DOCUMENTS

CN    102193320 A    9/2011
CN    102692830 A    9/2012
(Continued)

OTHER PUBLICATIONS

English Language Abstract for Japanese Patent Publication No. JPH11307436, published Nov. 11, 1999, 2 pages; which is a counterpart to Dutch Patent Publication No. NL10118888, published Jan. 7, 2000.

(Continued)

*Primary Examiner* — Hung Henry Nguyen
(74) *Attorney, Agent, or Firm* — Sterne, Kessler, Goldstein & Fox P.L.L.C.

(57) ABSTRACT

A system and method are provided for determining deformation of a patterning device and/or shift position of the (Continued)

patterning device relative. The system includes a first sensing sub-system that measures respective positions of a plurality of reference marks on the patterning device, and a second sensing sub-system that measures positions of the edge of the patterning device relative to the support. The system further includes a controller to determine an absolute position of the patterned portion and change in the absolute position based on measured respective positions of marks on the patterning device, determine a change in a relative position of the edge of the patterned device based on the measured edge positions, and estimate a change in a position of the patterning device relative to the support and a change in a pattern distortion of the patterned portion of the patterning device over a time period.

25 Claims, 8 Drawing Sheets

(51) Int. Cl.
  *G03F 7/20* (2006.01)
  *G01B 11/14* (2006.01)
(52) U.S. Cl.
  CPC ...... *G03F 7/70775* (2013.01); *G03F 7/70783* (2013.01); *G03F 7/70875* (2013.01)
(58) Field of Classification Search
  USPC .............................................. 355/52, 53, 55
  See application file for complete search history.

(56) References Cited

U.S. PATENT DOCUMENTS

| | | | |
|---|---|---|---|
| 5,751,404 | A | 5/1998 | Murakami et al. |
| 5,894,056 | A * | 4/1999 | Kakizaki ............. G03F 7/70358 355/53 |
| 6,653,639 | B1 | 11/2003 | Novak |
| 8,745,546 | B2 | 6/2014 | Chiu |
| 2009/0147236 | A1 | 6/2009 | De Vos et al. |
| 2011/0033790 | A1 | 2/2011 | Mishima |
| 2012/0244459 | A1 | 9/2012 | Chou et al. |

FOREIGN PATENT DOCUMENTS

| | | |
|---|---|---|
| CN | 103186059 A | 7/2013 |
| EP | 1 182 509 B1 | 2/2002 |
| EP | 1 443 364 B1 | 8/2004 |
| JP | H07-176468 A | 7/1995 |
| JP | H10-247617 A | 9/1998 |
| NL | 1011888 C2 | 1/2000 |

OTHER PUBLICATIONS

Translation of Taiwanese Office Action directed to related Taiwanese Patent Publication No. TW201546576, dated Jun. 27, 2016; 3 pages.
"Photomasks with Integral Laser Mirrors and Calibration of Integral Laser Mirrors on Photomasks," IBM Corporation, IBM Technical Disclosure Bulletin, vol. 32, No. 5B, 1989; pp. 19-21.
International Search Report and Written Opinion of the International Search Authority to related International Patent Application No. PCT/EP2015/054650, dated Jul. 1, 2015; 12 pages.

* cited by examiner

ESTIMATING DEFORMATION OF A PATTERNING DEVICE AND/OR A CHANGE IN ITS POSITION

CROSS-REFERENCE TO RELATED APPLICATIONS

This application is related to U.S. Provisional Patent Application No. 61/985,222, filed Apr. 28, 2014 which is incorporated by reference herein in its entirety.

FIELD

The present disclosure relates to a measurement system and measurement method to estimate either deformation of a patterning device and/or a change in its position in a lithographic apparatus.

RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A key performance parameter of any lithographic process, particularly one used for the manufacture of semiconductor devices, is the so-called overlay. Overlay is the accuracy (or the error) to which features in an applied pattern can be positioned directly on top of cooperating features applied to the same substrate in an earlier step. Modern lithographic processes may apply many measurements, modeling and correction steps to eliminate sources of error in the positioning of features, to achieve overlay of only a few nanometers. As the performance of lithographic apparatuses improves, reticle deformations, caused by for example clamping stresses, sagging, and reticle heating during exposures, are becoming a limiting factor for overlay improvements.

Reticle deformations occur due to reticle heating. The thermal stresses result in distortion of the pattern in the plane of the reticle (X- and Y-directions), causing movements of the pattern in the XY-plane. Known methods do not provide for the measurement of many such deformations let alone the correction of such in-plane distortions. Marks are used on the reticle to measure some of these deformations but the means to measure many in-plane distortions is not readily available. Measurements of these marks cannot be done during exposure of the reticle so the marks are measured sequentially to the exposure resulting in throughput penalty. Only few marks are measured so accuracy of the deformations of the pattern of the reticle is compromised. Including additional marks over the reticle to improve accuracy would result in more throughput penalty as the time required to measure additional marks across the pattern would tend to reduce throughput of the lithographic apparatus.

Accordingly, measuring additional marks to determine and compensate for distortions in the plane of the reticle is not optimal.

SUMMARY

Accordingly, it is desirable to provide a way of enabling measurement from a patterning device to estimate distortions across a patterning device such as a reticle or a change in a position of the patterning device relative to a support to make corrections to an exposure process.

In one embodiment, a method of determining a deformation of a patterning device or a shift in a position of the patterning device is provided. The patterning device has an edge between two major surfaces and a patterned portion, which in operation is illuminated with a radiation beam so as to impart a pattern to the radiation beam in its cross-section. The method comprises measuring respective positions of a plurality of reference marks with respect to a reference co-ordinate system and a reference timing system to determine an absolute position of the patterned portion, wherein the plurality of reference marks are distributed around the patterned portion in a peripheral portion of the patterning device; measuring a position of the edge of the patterning device relative to a support provided to hold the patterning device; after a period of operation of the patterning device, measuring again the position of the edge of the patterning device relative to the support; and estimating at least one of a change in a position of the patterning device relative to the support and a pattern distortion of the patterned portion of the patterning device as a change in the absolute position of the patterned portion of the patterning device over the period of operation of the patterning device based on the measured respective positions of the plurality of reference marks, the measured position of the edge of the patterning device and the measured again position of the edge of the patterning device.

In another embodiment, a method of determining a deformation of a patterning device or a shift in a position of the patterning device is provided. The patterning device has a patterned portion, which in operation is illuminated with a radiation beam so as to impart a pattern to the radiation beam in its cross-section. The method comprises determining at least one of an absolute position of the patterned portion of the patterning device and a change in the absolute position of the patterned portion of the patterning device by measuring respective positions of a plurality of reference marks on the patterning device when not exposing the patterned portion of the patterning device; determining a change in a relative position of an edge of the patterning device by measuring positions of the edge of the patterning device relative to a support provided to hold the patterning device when not exposing the patterned portion of the patterning device and during exposing of a target portion of a substrate with the radiation beam that is patterned by the patterning device in a lithographic process; and estimating at least one of a change in a position of the patterning device relative to the support and a change in a pattern distortion of the patterned portion of the patterning device over a time period based on the at least one of the absolute position of the patterned portion and the determined change in the absolute position of the patterned portion and the determined change in the relative position of the edge of the patterning device.

In yet another embodiment, a measurement system is provided for determining a deformation of a patterning device or a shift in a position of the patterning device. The patterning device has a patterned portion, which in operation is illuminated with a radiation beam so as to impart a pattern to the radiation beam in its cross-section. The system comprises a first sensing sub-system including a plurality of first sensors that measure respective positions of a plurality of reference marks on the patterning device. The system further comprises a second sensing sub-system including one or more second sensors that measure positions of the edge of the patterning device relative to a support provided to hold the patterning device. And the system further comprises a controller to determine at least one of an absolute position of the patterned portion of the patterning device and a change in the absolute position of the patterned portion of the patterning device based on the measured respective positions of the plurality of reference marks on the patterning device, determine a change in a relative position of the edge of the patterned device based on the measured positions of the edge of the patterning device relative to the support provided to hold the patterning device, and estimate at least one of a change in a position of the patterning device relative to the support and a change in a pattern distortion of the patterned portion of the patterning device over a time period based on the at least one of the absolute position of the patterned portion and the determined change in the absolute position of the patterned portion and the determined change in the relative position of the edge of the patterning device.

In a further embodiment, a lithographic apparatus is provide that comprises an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a measurement system. The measurement system comprises a first sensing sub-system including a plurality of first sensors that measure respective positions of a plurality of reference marks on the patterning device. The system further comprises a second sensing sub-system including one or more second sensors that measure positions of the edge of the patterning device relative to a support provided to hold the patterning device. And the system further comprises a controller to determine at least one of an absolute position of the patterned portion of the patterning device and a change in the absolute position of the patterned portion of the patterning device based on the measured respective positions of the plurality of reference marks on the patterning device, determine a change in a relative position of the edge of the patterned device based on the measured positions of the edge of the patterning device relative to the support provided to hold the patterning device, and estimate at least one of a change in a position of the patterning device relative to the support and a change in a pattern distortion of the patterned portion of the patterning device over a time period based on the at least one of the absolute position of the patterned portion and the determined change in the absolute position of the patterned portion and the determined change in the relative position of the edge of the patterning device.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
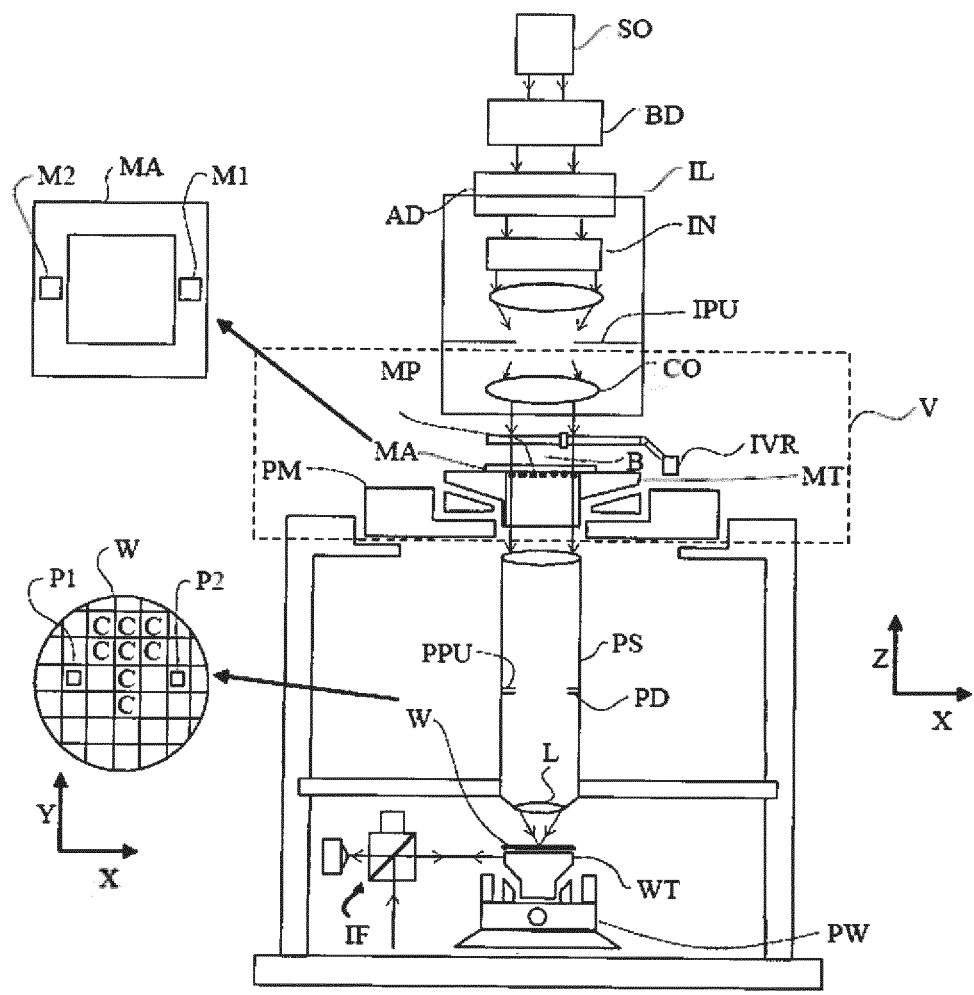
FIG. 1 depicts a lithographic apparatus according to an embodiment of the invention.

The features and advantages of the present invention will become more apparent from the detailed description set forth below when taken in conjunction with the drawings. Generally, the drawing in which an element first appears is typically indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

FIG. 1 schematically depicts a lithographic apparatus according to one embodiment of the invention. The apparatus comprises:

an illumination system (illuminator) IL configured to condition a radiation beam B (e.g., UV radiation or EUV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters;

a projection system (e.g., a refractive projection lens system) PS configured to project a pattern imparted to the radiation beam B by patterning device MA onto a target portion C (e.g., comprising one or more dies) of the substrate W; and a lithography apparatus control unit LACU including programmable processing units and interfaces for controlling and synchronizing the functions of the functional elements listed above.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted minors impart a pattern in a radiation beam, which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable minor array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to readout of the position sensor IF. Overall control of the apparatus may be controlled by a central processing unit, communicating with these sub-systems processing units, with operators and with other apparatuses involved in the lithographic manufacturing process.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
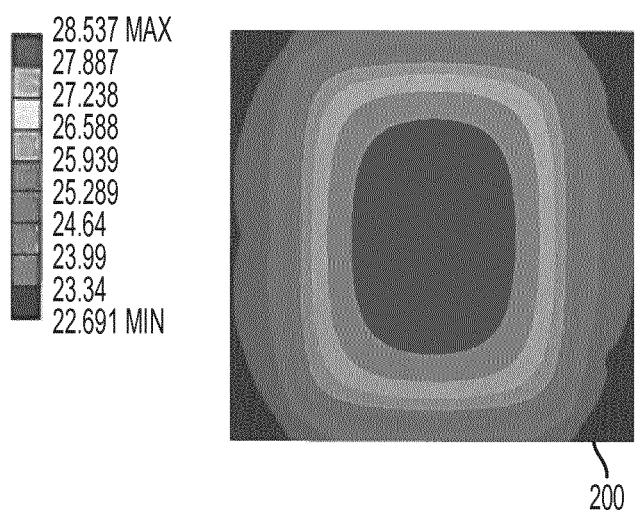
FIG. 2 illustrates schematically a temperature map of a heated patterning device showing the effect of heating in the patterning device.

FIG. 2 is a simplified schematic diagram of a temperature map of a heated patterning device showing the effect of heating in the patterning device MA, for understanding the present invention. The patterning device MA may be a transmissive mask or reticle 200. The reticle 200 may be for example a quartz substrate with a pattern of chrome metal and has a peripheral region surrounding an active (pattern bearing) region herein called a patterned portion. The patterned portion of the reticle 200 in operation is illuminated with a radiation beam B so as to impart a pattern to the radiation beam B in its cross-section.

FIG. 2 illustrates the problem of reticle heating that may arise in optical lithography, whether the reticle 200 is transmissive, as in this example, or reflective, as in other embodiments. Under the influence of the radiation beam B, which is partially absorbed by the reticle 200 during exposures, the material of the reticle will tend to heat up, causing thermal expansion and distortion in three dimensions. The area of heating extends generally over the exposed or patterned region. A typical reticle exhibits a rise in temperature over many exposure operations, gradually reaching a steady state after a number of exposures and wafer loading operations. However, the exact value of the time constant, and its relation to the number of exposures and the number of wafers exposed depends heavily on the exact details of the lithographic process, including the energy in the radiation beam B, the absorption of the particular type of reticle and the nature of the pattern applied, the heat capacity of the reticle material and the speed of operations.

In particular, a patterned portion of the reticle 200 has light (transparent) and dark (non-transparent) portions respectively, by which a pattern is imparted to the radiation beam B, i.e., the exposure light, which originates in the illumination system IL. Overlay performance, i.e., the accuracy of positioning one layer of the IC over another layer of the IC, is known to be affected by exposure light induced reticle heating. As can be seen from FIG. 2, the reticle 200 heats up non-uniformally. For example, the temperature in the central portion of the reticle is 28.537 degree C. (maximum) and around the periphery it is 22.691 degree C. (minimum). The absorbed energy from the radiation beam B during exposure heats up the reticle 200, causing the reticle 200 to expand. This expansion leads to a time and position dependent pattern displacement on the wafer.

Figure 3A:
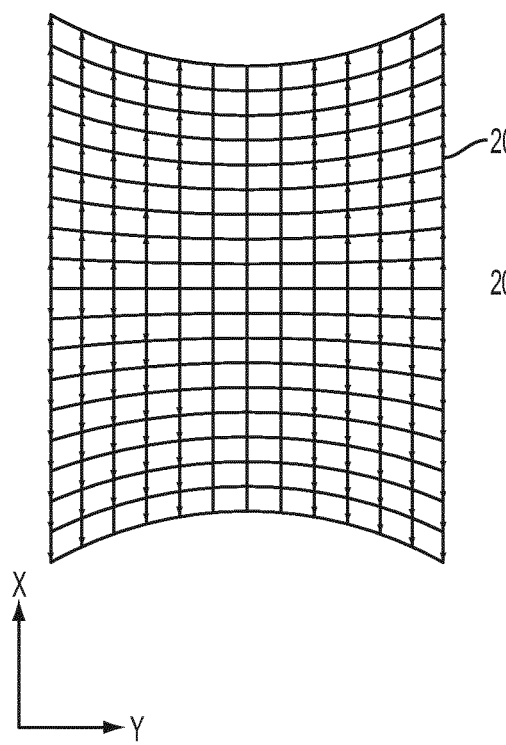
FIGS. 3(A-D) are a schematic view of different types of deformations of the patterning device.
Figure 3B:
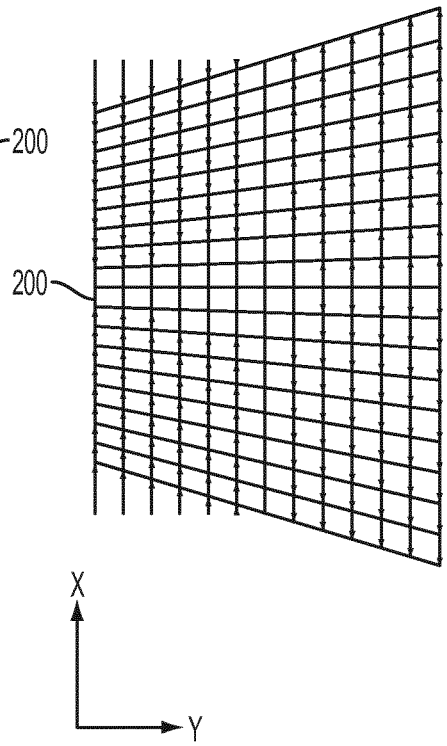
Figure 3C:
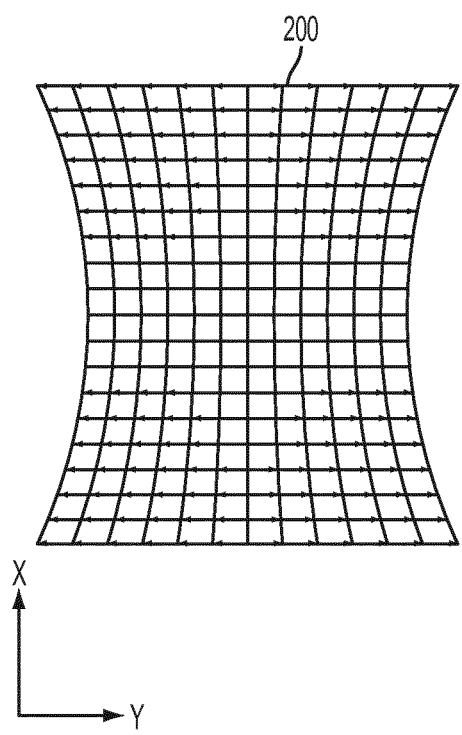
Figure 3D:
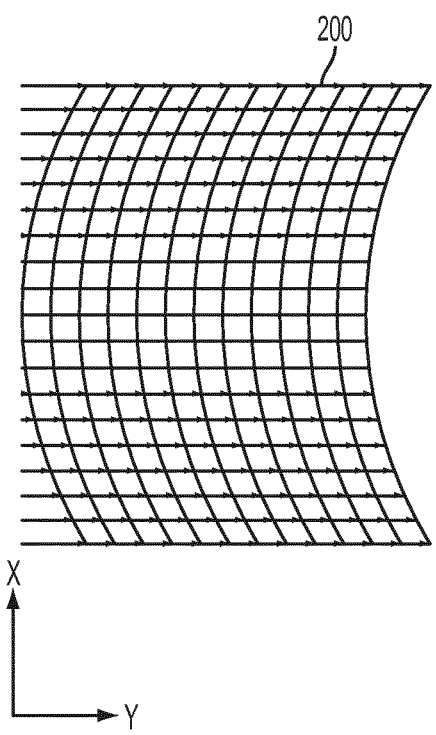

FIGS. 3A-3D show a schematic view of different types of exemplary in-plane deformations as pattern distortion shapes of the reticle 200 shown in FIG. 2. FIG. 3A shows a pattern distortion shape as bowing towards center of the reticle 200 along the top and bottom Y-edges. FIG. 3B shows expansion along the right X-edge of the reticle 200 and contraction along the left X-edge of the reticle 200. FIG. 3C shows bowing towards center of the reticle 200 along the left and right X-edges. FIG. 3D shows bowing towards left of the reticle 200 along the left and right X-edges.

Figure 4:
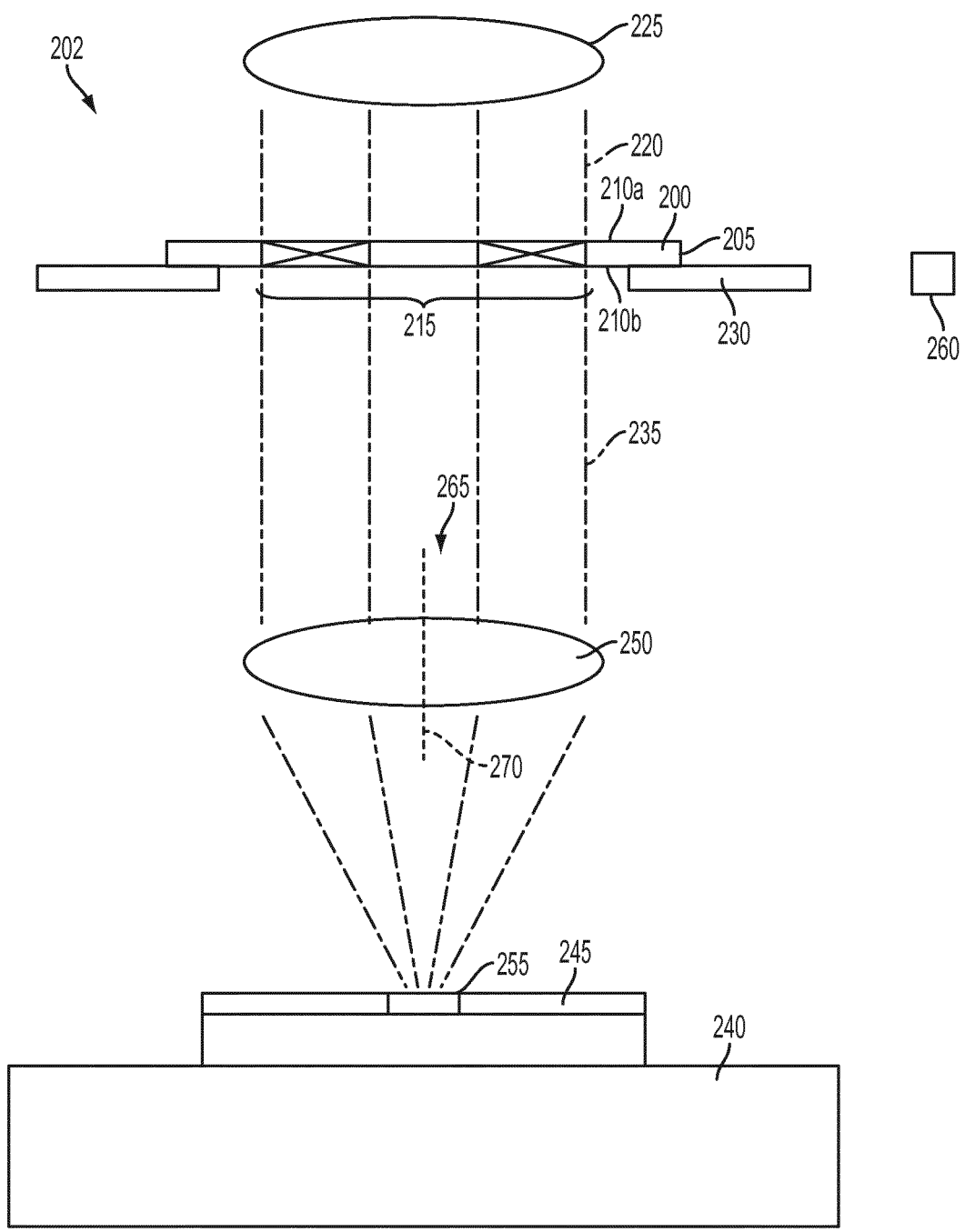
FIG. 4 illustrates schematically the mounting of the patterning device in the lithographic apparatus of FIG. 1.

In one embodiment, the 4 pattern distortion shapes of FIG. 3A-3D can be added together in a metrology process to represent a pattern deformation of the reticle 200. For example, an arbitrary deformation of the reticle 200 may be decomposed as a fraction of deformation shown in FIG. 3A, a fraction of deformation shown in FIG. 3B, a fraction of deformation shown in FIG. 3C, a fraction of deformation shown in FIG. 3D that may be added to get an actual representation of a pattern distortion shape of the reticle 200. Once a pattern distortion shape of the reticle 200 is estimated like this, e.g., one or more manipulators in the lithographic apparatus of FIG. 1 may be used to correct for the pattern distortion shape indicative of a deformation of the reticle 200. For example, a pattern distortion shape of the reticle 200 may be corrected by moving a wafer stage or manipulating a projection lens. By measuring the pattern distortion shapes of FIG. 3A-3D, in one embodiment, the lithographic apparatus of FIG. 1 may determine which kind of deformation and to what extent of a deformation of the reticle 200 may be happening at a certain point in time due to reticle heating caused by exposures. FIG. 4 illustrates schematically the mounting of the reticle 200 in a lithographic apparatus 202, which is a simplified view of the lithographic apparatus shown in FIG. 1. The reticle 200 includes an edge 205 between two major surfaces 210a, 210b and a patterned portion 215, which in operation is illuminated with a radiation beam 220 so as to impart a pattern to the radiation beam in its cross-section. The lithographic apparatus 202 may include an illumination system 225 configured to condition the radiation beam 220. The lithographic apparatus 202 may further include a support 230 to support the reticle 200, which is being capable of imparting the radiation beam 220 with a pattern in its cross-section to form a patterned radiation beam 235. The lithographic apparatus 202 may further include a substrate table 240 to hold a substrate 245 such as a wafer. The lithographic apparatus 202 may further include a projection system 250 that is configured to project the patterned radiation beam 235 onto a target portion 255 of the substrate 245.

In one embodiment of the present invention, a sensor 260 may be provided for measuring a position of the support 230 relative to a lens top 265 of a projection objective lens of the projection system 250 of the lithographic apparatus 202. Examples of the sensor 260 include a displacement sensor that measures distance. For example, an interferometer, an encoder or a cap sensor may be used. The projection objective lens of the projection system 250 may have an optical axis 270.

Figure 5:
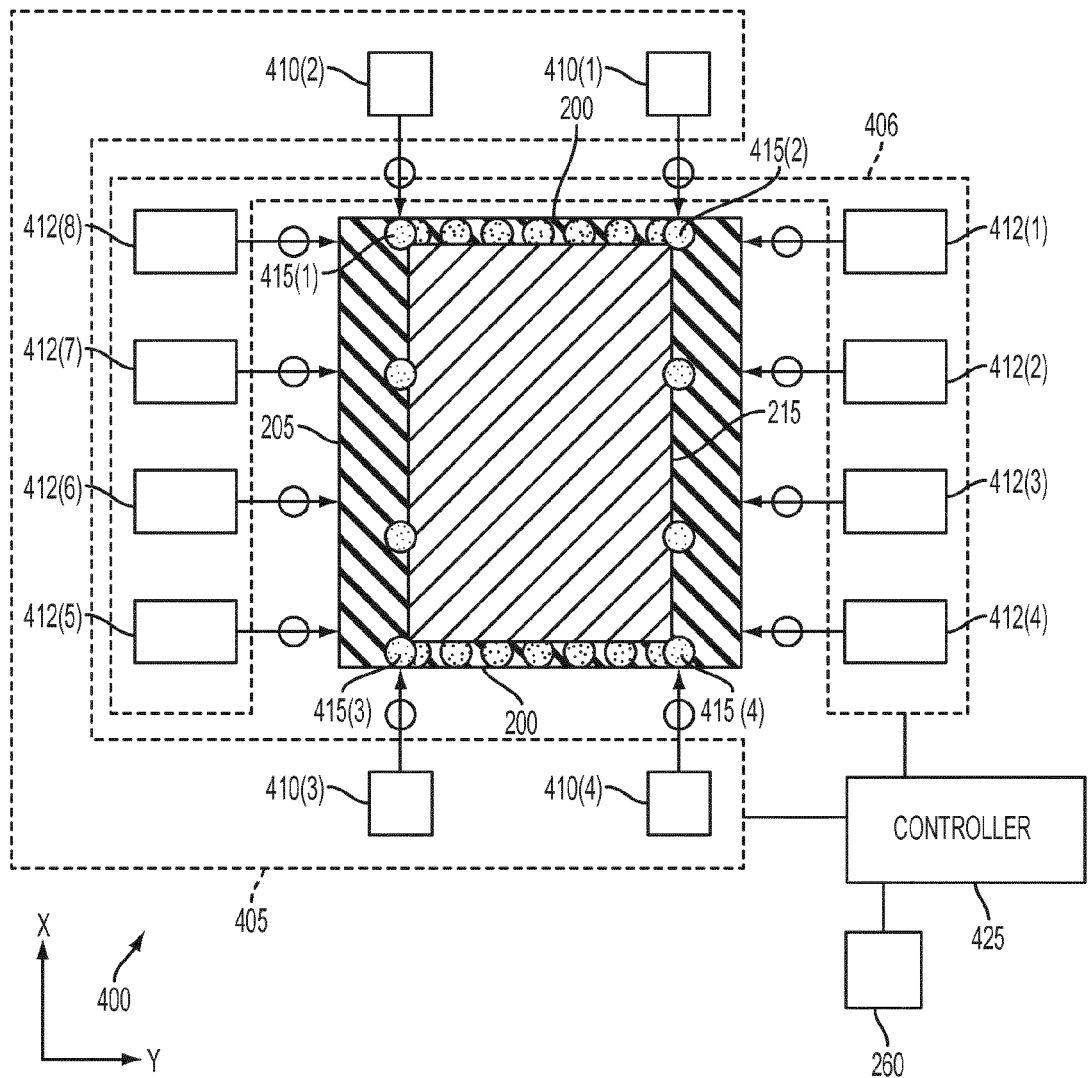
FIG. 5 illustrates a measurement system to measure distortions across the patterning device according to an embodiment of the invention.

FIG. 5 illustrates a measurement system 400 to measure distortions across the reticle 200 according to an embodiment of the invention. The reticle 200 is shown in a plan view, with the X and Y axes shown. Reticle 200, which is for example a quartz substrate with a pattern of chrome metal, has a peripheral region surrounding the patterned portion 215. Within the patterned portion 215, one or more device pattern regions are arranged (not shown). The patterned portion 215, when imaged by the radiation beam 220 on the surface of substrate 245, will correspond to the area of one target portion 255 in the illustration of FIG. 4. These target portions are conveniently referred to as fields. Each field typically corresponds to one or more dies that will be cut from the substrate to form individual devices after completion of the lithographic processes. The lithographic apparatus 202 in this example is of the scanning type, mentioned above. A slit-shaped band of illumination S is schematically indicated, moving across reticle 200 in a scanning direction. The scanning direction is parallel to the Y axis, according to convention. The lithographic apparatus 202 in another example may be a stepper type.

In accordance with one embodiment, a plurality of reference marks 415(1-m) may be provided along both sides of the reticle 200, which are perpendicular to the scanning direction. The patterned portion 215 of the reticle 200 may generally be rectangular in extent. Alternatively, the plurality of reference marks 415(1-m) may be distributed along all four sides of a rectangle. Providing the plurality of reference marks 415(1-m) along the X-edge and Y-edge of the reticle 200 enables the measurement system 400 to measure various pattern distortion shapes of the reticle 200, e.g., as shown in FIGS. 3A-3D.

The measurement system 400 may include a first sensing sub-system 405 including a plurality of first sensors 410(1-n) that measure respective positions of the plurality of reference marks 415(1-m) on the reticle 200. The plurality of reference marks 415(1-4) may be distributed around the patterned portion 215 in a peripheral portion of the reticle 200, as shown in FIG. 4. The measurement system 400 may include a second sensing sub-system 406 including a plurality of second sensors 412(1-k) that measure positions of the edge 205 of the reticle 200 relative to the support 230 (not shown, e.g., the mask table MT of FIG. 1) provided to hold the reticle 200.

Examples of a first sensor 410 include an optical sensor. For example, a CCD camera at a wafer stage and an illuminator using the exposure radiation of the lithographic apparatus may be used. Examples of a second sensor 412 include a displacement sensor that measures distance. For example, an interferometer, an encoder or a cap sensor may be used.

One or more first sensors 410 may be provided for measuring respective positions of reference marks 415 along the Y-edge of the reticle 200 to measure in-plane bowing of the top and bottom edges of the reticle 200 as shown in FIG. 3A. Likewise, one or more first sensors 410 may be provided for measuring respective positions of reference marks 415 along the X-edge of the reticle 200 to measure in-plane bowing of the left and right edges of the reticle 200 as shown in FIG. 3C. One or more second sensors 412 may be provided to measure positions of the edge 205 of the reticle 200 in order to estimate how the distortion of the patterned portion 215 is changing over time relative to a perfect or reference or non-heated pattern.

The measurement of the position of the reference mark 415 on the reticle 200 indicates how the patterned portion 215 is distorted and measurement of the position of the edge 205 indicates how this distortion of the patterned portion 215 is changing over time as the measurement of the position of the edge 205 may be correlated to the distortion of the patterned portion 215. The first sensor 410 may measure a position of a reference mark 415 on the reticle 200 less frequently and the second sensor 412 may measure a position of the edge 205 of the reticle 200 more frequently in between periods of measurements with the first sensor 410 to correct for a distortion of the patterned portion 215 of the reticle 200. Since the first sensor 410 is looking at the reference marks 415 on the reticle surface it is not feasible or at least very difficult to accurately measure the reference marks 415 while exposing an image area, i.e., the patterned portion 215 or a portion of it, but since the edge 205 of the reticle 200 is outside the area of the patterned portion 215, the second sensor 412 may measure even during exposure of parts of the patterned portion 215. The first measurement of the position of the edge 205 of the reticle 200 is treated as a reference measurement to track how the edge 205 is moving over time.

While the reference marks 415 may be located with respect to the patterned portion 215 within a sub-nanometer level accuracy (position tolerance), the edge 205 of the reticle 200 may be located with respect to the patterned portion 215 within a micron level accuracy (position tolerance). The reference marks 415 are printed on the reticle 200 and very accurately located with respect to the patterned portion 215. As the patterned portion 215 of the reticle 200 moves the reference marks 415 move with it in a constant relationship. So when the reference marks 415 on the reticle 200 and the edge 205 of the reticle 200 may be simultaneously or near simultaneously measured then a sub-nanometer level accuracy can be obtained since the distortion has not changed if both are measured at the same instant of time. So the two measurements can be correlated and the micron level position uncertainty can be turned into a sub-nanometer level position uncertainty as the first sensors 410 and the second sensors 412 are zeroed and referenced to each other.

Consistent with one embodiment of the present invention, the measurement system 400 may further include a controller 425 to determine at least one of an absolute position of the patterned portion 215 of the reticle 200 and a change in the absolute position of the patterned portion 215 of the reticle 200 based on the measured respective positions of the plurality of reference marks 415(1-$m$) on the reticle 200.

In operation, all or a particularly chosen subset of the plurality of reference marks 415(1-$m$) along the edges of the patterned portion 215 may be measured. For example, respective positions of a set of reference marks 415(1-4) may be measured to determine an absolute position of the set of reference marks 415(1-4). In one embodiment, the absolute position of the set of reference marks 415(1-4) of the reticle 200 being indicative of an absolute position of the patterned portion 215 may be their position relative to the lens top 265 as the location of the set of reference marks 415(1-4) on the reticle 200 with respect to the location of the patterned portion 215 is fixed and known. And an absolute position of the patterned portion 215 may be based on a first or reference measurement of the positions of the set of reference marks 415(1-4). Alternatively, an absolute position of the patterned portion 215 may be based on a first or reference measurement of the positions of the set of reference marks 415(1-4) and a substantial simultaneous a first or reference measurement of the edge of 205 of the reticle 200 at or near the same instant when the positions of the set of reference marks 415(1-4) are measured.

The controller 425 may further determine a change in a relative position of the edge 205 of the reticle 200 based on the measured positions of the edge 205 of the reticle 420 relative to the support (not shown) that is provided to hold it. A relative position of the edge 205 of the reticle 200 may be measured relative to the support 230, which is being provided to hold the reticle 200. After a period of operation of the reticle 200, the position of the edge 205 of the reticle 200 may be measured again relative to the support 230. That is, when the edge 205 changes a relative change of the edge 205 is measured and based on it a relative change in the patterned portion 215 is obtained. The measured position of the edge 205 of the reticle 200 is compared with the measured again position of the edge 205, to identify deviations in the position of the edge 205 hence any change in position of the patterned portion 215 of the reticle 200 until a next measurement is made for the positions of the set of reference marks 415(1-4). These deviations may be recorded as separate $\Delta x$ and $\Delta y$ values for each position on the edge 205, for example. These positional deviations of the edge 205 may be applied in the control of exposure operations, so that the positioning of the patterned portion 215 from the reticle 200 at a desired position on the substrate 245 is corrected for the positional deviations caused by heating. Any desired accuracy can be achieved by increasing the number of reference marks 415 and measuring more positions on the edge 205. Not only the in-plane deformations such as x-y deformations are measured and estimated but the second sensors 412 may be arranged such that they monitor the edge 205 positions at different heights (in other words, at different z-axis (perpendicular to the x-y plane) values), which enable modeling of 3-directional (3D) of the reticle 200 deformations.

The controller 425 may further estimate a change in a pattern distortion of the patterned portion 215 of the reticle 200 over a time period based on the at least one of the absolute position of the patterned portion 215 and the determined change in the absolute position of the patterned portion 215 and the determined change in the relative position of the edge 205 of the reticle 200. The pattern distortion represents a change in different portions of the patterned portion 215 relative to one another over a time period.

According to one embodiment of the present invention, the sensor 260 may measure a position of the support 230 (not shown) relative to the lens top 265 of a projection objective lens of the lithographic apparatus 202, as shown in FIG. 4. The controller 425 may use the measured position the edge 205 of the reticle 200 relative to the support 230 and the measured position of the support 230 relative to the lens top 265 to provide a control input to a control loop such that the control input is representative of a position of the reticle 200 relative to the lens top 265 that defines the position of the reticle 200 relative to the optical axis 270 of the projection objective lens of the projection system 250, as shown in FIG. 4.

Figure 6:
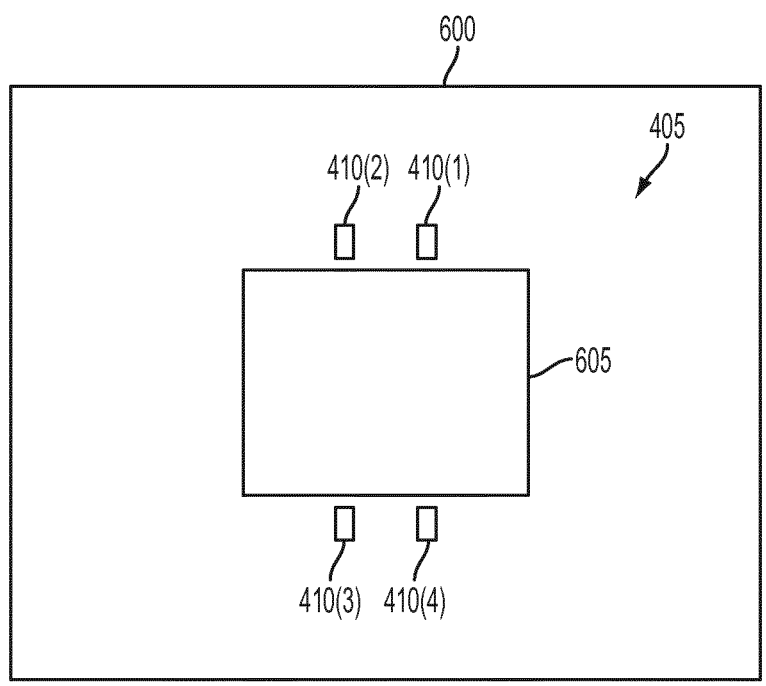
FIG. 6 illustrates a first sensor sub-system to measure positions of reference marks across the patterning device according to an embodiment of the invention.

FIG. 6 illustrates the first sensor sub-system 405, as shown in FIG. 5, to measure positions of the set of reference marks 415(1-4) across the reticle 200 (not shown) according to an embodiment of the invention. Referring to FIG. 4, an embodiment of the support 230 is shown as a reticle chuck 600. The reticle chuck 600 is configured to hold the reticle 200. The reticle chuck 600 includes a reticle cavity 605. The patterned portion 215 of the reticle 200 is positioned in the reticle cavity 605 for exposure by the radiation beam 220. The first sensor sub-system 405a includes a set of first sensors 410(1-4) to measure respective positions of the set of reference marks 415(1-4) on the reticle 200.

Figure 7:
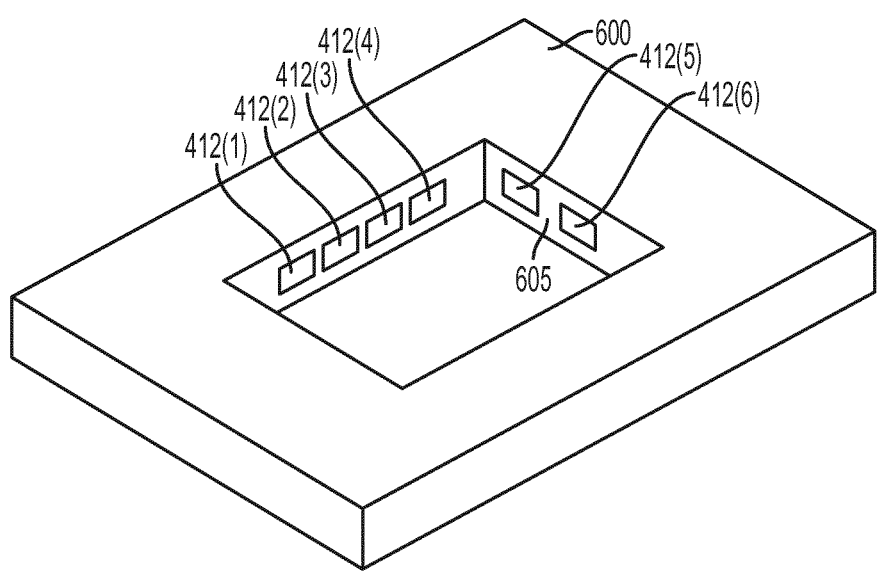
FIG. 7 illustrates a second sensor sub-system to measure positions on the side edge of the patterning device according to an embodiment of the invention.

FIG. 7 illustrates the second sensor sub-system 406 to measure positions on the side edge 205 of the reticle 200 according to an embodiment of the invention. The second sensing sub-system 406 includes a set of second sensors 412(1-6) to measure positions of the edge 205 of the reticle 200 relative to the support 230 (herein shown as the reticle chuck 600). The set of second sensors 412(1-6) may be located in the reticle cavity 605 of the reticle chuck 600.

In operation, the set of second sensors 412(1-6) measure positions of the reticle 200 relative to the reticle chuck 600 and the sensor 260 of FIG. 4 measures the position of the reticle chuck 600 relative to the lens top 265. By using this information, a position of the reticle 200 relative to the lens top 265 can be determined. So a control servo loop controlling position of a reticle stage (not shown) that includes the reticle chuck 600 may use the position of the reticle 200 relative to the lens top 265 instead of position of the reticle stage, i.e., the reticle chuck 600 position measured by the sensor 260.

One or more second sensors 412 located on the Y-edge may measure reticle slip. Not only along the Y-edge, in one embodiment, a combination of second sensors 412 along all edges of the reticle 200 may be used to determine a slip in the scan direction. Moreover, a rotation of the reticle 200 along the z-axis, or a combination of the slip and rotation may be determined. The controller 425 may discriminate between this type of reticle slips and reticle shape changes, because slip/rotation would result in correlated changes in the edge measurements. The measured positions on the side edge 205 of the reticle 200 may be fed to the control servo loop to adjust the position of the reticle stage for correcting for the reticle slip. The control servo loop would have a reference position that the reticle stage is trying to follow, the sensor 260 provides the actual position of the reticle stage and a feedback loop is provided to match the measured position to the reference position. A real-time feedback from one or more second sensors 412 located on the X-edge may enable real-time adjustment of the exposure during the exposure of one wafer itself for each die or during exposure of a single die by adjusting position of either the reticle or wafer stage.

For example, before the exposure the set of first sensors 410(1-4) may measure the respective positions of the set of reference marks 415(1-4) on the reticle 200. And the set of second sensors 412(1-4) may measure one or more positions of the edge 205 of the reticle 200 relative to the support 230. After exposure of one wafer, the set of second sensors 412(1-4) may measure the one or more positions of the edge 205 of the reticle 200 to determine how the position or shape of the patterned portion 215 of the reticle 200 is changed in the XY-plane and the controller 425 may take this new information and apply it to the exposure correction mechanism. Then after a lot of wafers or certain number of wafers the set of first sensors 410(1-4) may measure again the respective positions of the set of reference marks 415(1-4).

Figure 8:
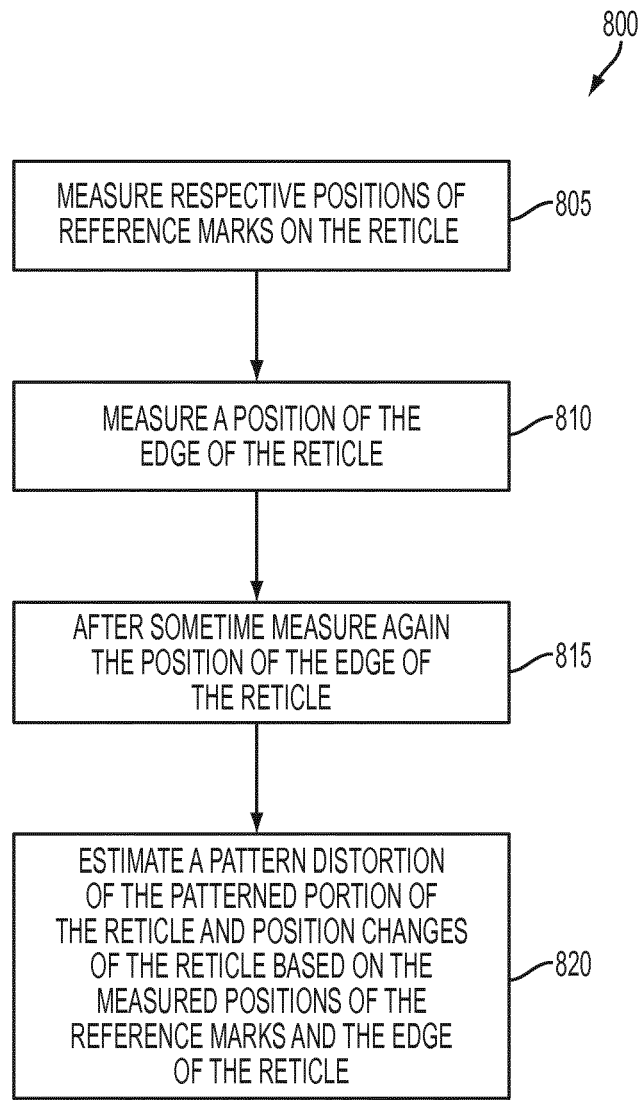
FIG. 8 is a flow chart illustrating the measurement process according to an embodiment of the invention.

FIG. 8 is a flow chart illustrating a measurement method 800 according to an embodiment of the present invention. The method 800 is provided for measuring deformations of a patterning device such as the reticle 200. The reticle 200 with the set of reference marks 415(1-4), device patterns in the patterned portion 215 and other alignment/metrology features is loaded onto the support 230 or patterning device support MT, and clamped by vacuum chucks.

At block 805, respective positions of the set of reference marks 415(1-4) may be measured with respect to a reference co-ordinate system and a reference timing system to determine an absolute position of the patterned portion 215. An example of the reference co-ordinate system includes a co-ordinate system in which the positions of the support 230 (or the reticle chuck 600) and the lens top 265 are defined. An example of the reference timing system includes a timing system in which timing of taking the measurements of positions of the set of reference marks 415(1-4) and timing of taking the measurements of positions of the edge 205 of the reticle 200 are defined. The positions of the set of reference marks 415(1-4) may be measured as a reference for future use with respect to the lens top 265. After a period of time, particularly a period of exposure operations in which reticle heating might occur, the positions of the set of reference marks 415(1-4) are again measured. These positions may be used, for example, to identify deformations of the reticle caused by, e.g., heating of the reticle.

At block 810, a position of the edge 205 of the reticle 200 may be measured relative to the support 230, which is being provided to hold the reticle 200. At block 815, after a period of operation of the reticle 200, the position of the edge 205 of the reticle 200 may be measured again relative to the support 230. Measuring a position of the edge 205 of the patterning device may include continuously measuring the position of the edge 205 of the reticle 200 by sampling at a desired frequency (e.g., 10 kHz) during exposing of the target portion 255 of the substrate 245 to the patterned radiation beam 235 so as to apply the pattern 215 from the reticle 200 to the substrate 245 by a lithographic process.

Consistent with one embodiment of the present invention, the method 800 may further include measuring again the positions of the set of reference marks 415(1-4) with respect to the reference co-ordinate system and the reference timing system after a first period of operation of the reticle 200. And measuring again the position of the edge 205 of the reticle 200 relative to the support 230 after a second period of operation of the reticle 200. In one embodiment, the first period of operation of the reticle 200 may be different from the second period of operation of the reticle 200 so that the set of reference marks 415(1-4) being measured less frequently than the edge 205 of the reticle 200.

According to one embodiment of the present invention, the step 815 of measuring again the position of the edge 205 of the reticle 200 includes measuring a distance to the edge 205 of the reticle 200 during exposing of the target portion 255 of the substrate 245 to the patterned radiation beam 235 so as to apply the pattern 215 from the reticle 200 to the substrate 245 by a lithographic process. In the step 810, measuring a position of the edge 205 of the reticle 200 further includes measuring the respective positions of the set of reference marks 415(1-4) substantially simultaneously to measuring the position of the edge 205 of the reticle 200 relative to the support 230.

At block 820, a pattern distortion of the patterned portion 215 of the reticle 200 may be estimated as a change in the absolute position of the patterned portion 215 of the reticle 200 over the period of operation of the reticle 200 based on the measured respective positions of the set of reference marks 415(1-4), the measured position of the edge 205 of the reticle 200 and the measured again position of the edge 205 of the reticle 200. The edge measurements may also be used to detect a shift (slip, rotation) of the reticle 200. And based on measurements of the edge 205 not only a deformation of the patterned portion 215, but also position changes of the reticle 200 due to its slip, or rotation due to accelerations may be determined. The deformation information and position change information then be used to correct the position of the image, i.e., the patterned portion 215 (and thus to improve overlay).

In accordance with one embodiment of the present invention, the method 800 further includes repeating exposing to apply the patterned portion 215 to a succession of target portions on the substrate 245, without repeating the step of the measuring again the positions of the set of reference marks 415(1-4) every exposure. Alternatively, the method 800 includes repeating exposing to apply the patterned portion 215 to a succession of target portions on more than one substrates and repeating the step of the measuring again the positions of the plurality of reference marks every time a new substrate is loaded into the lithographic apparatus 202 after exposure of a predetermined number of substrates.

Exposing may be performed several times for each of a succession of substrates loaded into the lithographic apparatus 202, and the step of the measuring again the positions of the set of reference marks 415(1-4) may be performed when a new substrate is loaded into the lithographic apparatus 202. Alternatively, exposing may be performed several times for each of a lot of substrates loaded into the lithographic apparatus 202, and the step of the measuring again the positions of the set of reference marks 415(1-4) may be performed when a new substrate is loaded into the lithographic apparatus 202 from a next lot of substrates.

The heating and consequent distortion of the reticle 200 may vary quite slowly during normal operation, in which case frequent measurement would be unnecessary. Therefore, in a practical embodiment, the reference mark 415 positions are measured only intermittently, when throughput will not be unduly affected. The progressive heating of the reticle 200 or the patterning device MA in-between the measurements of the plurality of reference marks 415(1-m) can be determined by the measurements of the edge 205, so that deformation of the reticle 200 in-between the reference mark 415 measurements can also be determined to a desired level of accuracy. Since it is possible to make the deformation measurements during the exposures of different target portions (fields), a gain in alignment accuracy of the exposed pattern can be achieved without the throughput penalty.

According to the method 800, the controller 425 may determine either an absolute position of the patterned portion 215 of the reticle 200 or a change in the absolute position of the patterned portion 215 of the reticle 200 by measuring respective positions of the set of reference marks 415(1-4) on the reticle 200 when not exposing the patterned portion 215 of the reticle 200. By measuring positions of the edge 205 of the reticle 200 relative to the support 230 when not exposing the patterned portion 215 of the reticle 200 and during exposing of the target portion 255 of the substrate 245 with the radiation beam 220 the controller 425 may determine a change in a relative position of the edge 205 of the reticle 200.

According to the method 800, the controller 425 may then estimate a change in a pattern distortion of the patterned portion 215 of the reticle 200 over a time period based on either the absolute position of the patterned portion 215 and the determined change in the absolute position of the patterned portion 215 and/or the determined change in the relative position of the edge 205 of the reticle 200. The method 800 may further include measuring a position of the support 230 provided to hold the reticle 200 relative to the lens top 265 of the projection objective lens of the lithographic apparatus 202. A control input representative of a position of the reticle 200 relative to the lens top 265 may be provided to a control loop based on the measured position of the edge 205 of the reticle 200 relative to the support 230 and the measured position of the support 230 relative to the lens top 265.

For example, the positions of the plurality of reference marks 415(1-m) on the reticle 200 may not be measured every wafer. The positions of the edge 205 of the reticle 200 may be measured in real-time during exposure so the positions of the plurality of reference marks 415(1-m) may need not to be measured very frequently in-between exposures as these measurements add throughput penalty but the measurement of the edge 205 of the reticle 200 do not. But instead of the edge 205 positions the position of patterned portion 215 need to be determined during the exposure. To this end, by combining the measurements of the edge 205 and the measurements of the plurality of reference marks 415(1-m), an initial condition of a pattern distortion of the patterned portion 215 may be determined. That is, e.g., it can be determined how the patterned portion 215 looks like at time t=0. And by continuing to measure the position of the edge 205 of the reticle during exposure or after exposure, a change in the distortion on the patterned portion 215 may be determined over time. In this way, with this real-time feedback the exposure process can be adjusted while exposing a wafer. However, the next measurements of the plurality of reference marks 415(1-m) may be done only after a lot of the wafers is finished exposing or even after many lots or is not done at all before the reticle 200 is unloaded.

The method 800 may further include exposing of the target portion 245 of the substrate 245 to the patterned radiation beam 235 so as to apply the pattern 215 from the reticle 200 to the substrate 245 by a lithographic process such that the step of exposing includes modifying at least one parameter of the exposing in accordance with the result of the estimating, in order to reduce overlay error between the applied pattern and a pattern existing on the substrate 245. So both overlay and throughput can be improved.

For example, in one embodiment of the present invention, the method 800 includes adjusting in real-time one or more parameters associated with exposure of the target portion 255 of the substrate 245 in a lithographic process during the exposure of the substrate 245 in response to a feedback indicative of the estimated change in the pattern distortion. One or more parameters associated with exposure of the target portion 255 of the substrate 245 during the exposure of the substrate 245 may be adjusted by the controller 425 in real-time in response to a feedback indicative of the estimated change in the pattern distortion.

The controller 425 may adjust in real-time one or more parameters associated with exposure of the target portion 255 (not shown) of the substrate 245 (not shown) during the exposure of the substrate 245 in response to a feedback indicative of the estimated change in the pattern distortion. In the case of scanning exposures, the lithographic apparatus 202 may be controlled to vary the relative X and Y positions of the reticle 200 and substrate 245, and also to vary magnification of the projection system 250, so as to improve matching the positions of device features on the reticle pattern 215 and features already present on the substrate 245 from previous exposures. Optionally, mechanical and/or thermal energy can be directed at parts of the reticle 200 so as to counter the thermal distortion actively. The aim of such measures may be to reduce the amount of distortion overall, or simply to redistribute the distortion to a shape that can be more effectively or more easily corrected using the available control parameters of the lithographic apparatus 202.

In a manufacturing process, e.g., substrate W (a semiconductor wafer or the substrate 245) is loaded into the lithography apparatus 202. Together with the substrate 245, a "recipe" of process parameters is received by control unit, according to which the lithographic apparatus 202 will be set up and operated. Some parameters may be set for a batch of similar substrates, other parameters may be specific to an individual substrate. Metrology functions are performed to measure the exact position of the substrate 245 and align it with the projection system 250. The X, Y position and height (Z) position are mapped with a desired resolution and accuracy across the surface of the substrate 245. The metrology results are stored by the control unit for use in controlling exposure operations. Exposure parameters are set in accordance with the recipe and the metrology results. The exposure process proceeds, typically by exposing successive fields (target portions C in FIG. 1) with the beam B of radiation patterned by the patterning device MA. Finally, the patterned product substrate is ejected and a next substrate is loaded.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of determining a deformation of a patterning device or a shift in a position of the patterning device, the patterning device having an edge between two major surfaces and a patterned portion which in operation is illuminated with a radiation beam so as to impart a pattern to the radiation beam in its cross-section, the method comprising:

measuring respective positions of a plurality of reference marks with respect to a reference co-ordinate system and a reference timing system to determine an absolute position of the patterned portion, wherein the plurality of reference marks are distributed around the patterned portion in a peripheral portion of the patterning device;

measuring a position of the edge of the patterning device relative to a support provided to hold the patterning device;

after a period of operation of the patterning device, measuring again the position of the edge of the patterning device relative to the support; and estimating at least one of a change in the position of the patterning device relative to the support and a pattern distortion of the patterned portion of the patterning device as a change in the absolute position of the patterned portion of the patterning device over the period of operation of the patterning device based on the measured respective positions of the plurality of reference marks, the measured position of the edge of the patterning device, and the subsequent measured again position of the edge of the patterning device.

2. The method of claim 1, wherein the measuring again the position of the edge of the patterning device comprises:

measuring a distance to the edge of the patterning device during exposing of a target portion of a substrate to the patterned radiation beam so as to apply the pattern from the patterning device to the substrate by a lithographic process.

3. The method of claim 1, wherein the measuring a position of the edge of the patterning device comprises substantially simultaneously measuring the respective positions of the plurality of reference marks and measuring the position of the edge of the patterning device relative to the support provided to hold the patterning device, wherein the pattern distortion represents a change in different portions of the patterned portion relative to one another over a time period.

4. The method of claim 3, further comprising:

adjusting, in real-time, one or more parameters associated with exposure of a target portion of a substrate in a lithographic process during the exposure of the substrate in response to a feedback indicative of at least one of the estimated change in the pattern distortion and the estimated change in the position of the patterning device.

5. The method of claim 1, further comprising:
measuring a position of the support provided to hold the patterning device relative to a lens top of a projection objective lens of a lithographic apparatus.

6. The method of claim 5, further comprising:
using the measured position of the edge of the patterning device relative to the support and the measured position of the support relative to the lens top to provide a control input to a control loop such that the control input is representative of a position of the patterning device relative to the lens top.

7. The method of claim 1, wherein the plurality of reference marks are distributed along both sides of the patterning device which are perpendicular to a scanning direction.

8. The method of claim 1, further comprising:
after a second period of operation of the patterning device, measuring again the respective positions of the plurality of reference marks; and
repeating exposing to apply the pattern to a succession of target portions on a substrate, without repeating the measuring again the positions of the plurality of reference marks every exposure.

9. The method of claim 1, further comprising:
after a second period of operation of the patterning device, measuring again the respective positions of the plurality of reference marks; and
repeating exposing to apply the pattern to a succession of target portions on a plurality of substrates and repeating the measuring again the positions of the plurality of reference marks every time a new substrate is loaded into the lithographic apparatus after exposure of a predetermined number of substrates.

10. The method of claim 9, wherein the exposing is performed several times for each of the succession of the plurality of substrates loaded into the lithographic apparatus, and the measuring again the positions of the plurality of reference marks is performed when a new substrate is loaded into the lithographic apparatus.

11. The method of claim 9, wherein the exposing is performed several times for each of the plurality of substrates loaded into the lithographic apparatus, and the measuring again the positions of the plurality of reference marks is performed when a new substrate is loaded into the lithographic apparatus from a next one of the plurality of substrates.

12. The method of claim 1, wherein the measuring a position of the edge of the patterning device comprises:
continuously measuring the position of the edge of the patterning device by sampling at a desired frequency during exposing of a target portion of a substrate to the patterned radiation beam so as to apply the pattern from the patterning device to the substrate by a lithographic process.

13. The method of claim 1, further comprising:
exposing a target portion of a substrate to the patterned radiation beam so as to apply the pattern from the patterning device to the substrate by a lithographic process, wherein the exposing comprises modifying at least one parameter of the exposing in accordance with the estimating, in order to reduce overlay error between the applied pattern and a pattern existing on the substrate.

14. The method of claim 1, wherein the patterned portion of the patterning device is substantially rectangular.

15. The method of claim 14, wherein the plurality of reference marks are distributed along all four sides of the patterned portion.

16. The method of claim 1, further comprising:
after a first period of operation of the patterning device, measuring again the positions of the plurality of reference marks with respect to the reference co-ordinate system and the reference timing system; and
after a second period of operation of the patterning device, measuring again the position of the edge of the patterning device relative to the support provided to hold the patterning device,
wherein the first period of operation of the patterning device is different from the second period of operation of the patterning device so that the plurality of reference marks being measured less frequently than the edge of the patterning device.

17. A method of determining a deformation of a patterning device or a shift in a position of the patterning device which in operation is illuminated with a radiation beam so as to impart a pattern to the radiation beam in its cross-section, the method comprising:
determining at least one of an absolute position of a patterned portion of the patterning device and a change in the absolute position of the patterned portion of the patterning device by measuring respective positions of a plurality of reference marks on the patterning device when not exposing the patterned portion of the patterning device;
determining a change in a relative position of an edge of the patterning device by measuring positions of the edge of the patterning device relative to a support provided to hold the patterning device when not exposing the patterned portion of the patterning device and during exposing of a target portion of a substrate with the radiation beam that is patterned by the patterning device in a lithographic process; and
estimating at least one of a change in the position of the patterning device relative to the support and a change in a pattern distortion of the patterned portion of the patterning device over a time period based on the at least one of the absolute position of the patterned portion and the determined change in the absolute position of the patterned portion and the determined change in the relative position of the edge of the patterning device.

18. The method of claim 17, further comprising:
adjusting, in real-time, one or more parameters associated with exposure of the target portion of the substrate during the exposure of the substrate in response to a feedback indicative of at least one of the estimated change in the pattern distortion and the estimated change in the position of the patterning device.

19. The method of claim 17, further comprising:
measuring a position of the support provided to hold the patterning device relative to a lens top of a projection objective lens of the lithographic apparatus; and
using the measured position of the edge of the patterning device relative to the support and the measured position of the support relative to the lens top to provide a control input to a control loop such that the control input is representative of a position of the patterning device relative to the lens top.

20. A measurement system for determining a deformation of a patterning device or a shift in a position of the patterning device having a patterned portion which in operation is illuminated with a radiation beam so as to impart a pattern to the radiation beam in its cross-section, comprising:
  a first sensing sub-system comprising a plurality of first sensors configured to measure respective positions of a plurality of reference marks on the patterning device;
  a second sensing sub-system comprising one or more second sensors configured to measure positions of an edge of the patterning device relative to a support provided to hold the patterning device; and
  a controller configured to:
    determine at least one of an absolute position of the patterned portion of the patterning device and a change in the absolute position of the patterned portion of the patterning device based on the measured respective positions of the plurality of reference marks on the patterning device,
    determine a change in a relative position of the edge of the patterned device based on the measured positions of the edge of the patterning device relative to the support provided to hold the patterning device, and
    estimate at least one of a change in the position of the patterning device relative to the support and a change in a pattern distortion of the patterned portion of the patterning device over a time period based on the at least one of the absolute position of the patterned portion and the determined change in the absolute position of the patterned portion and the determined change in the relative position of the edge of the patterning device.

21. The measurement system of claim 20, wherein the controller is configured to adjust, in real-time, one or more parameters associated with exposure of the target portion of the substrate during the exposure of the substrate in response to a feedback indicative of the estimated change in the pattern distortion.

22. The measurement system of claim 20, further comprising:
  a third sensor configured to measure a position of the support provided to hold the patterning device relative to a lens top of a projection objective lens of a lithographic apparatus,
  wherein the controller is configured to use the measured position the edge of the patterning device relative to the support and the measured position of the support relative to the lens top to provide a control input to a control loop such that the control input is representative of a position of the patterning device relative to the lens top that defines the position of the patterning device relative to an optical axis of the projection objective lens.

23. A lithographic apparatus comprising:
  an illumination system configured to condition a radiation beam;
  a support constructed to support a patterning device, the patterning device being capable of imparting the radiation beam with a pattern in its cross-section to form a patterned radiation beam;
  a substrate table constructed to hold a substrate;
  a projection system configured to project the patterned radiation beam onto a target portion of the substrate; and
  a measurement system for determining a deformation of the patterning device or a shift in a position of the patterning device having a patterned portion which in operation is illuminated with the radiation beam so as to impart the pattern to the radiation beam in its cross-section, the measurement system comprising:
    a first sensing sub-system comprising a plurality of first sensors configured to measure respective positions of a plurality of reference marks on the patterning device;
    a second sensing sub-system comprising one or more second sensors configured to measure positions of an edge of the patterning device relative to the support provided to hold the patterning device; and
    a controller configured to:
      determine at least one of an absolute position of the patterned portion of the patterning device and a change in the absolute position of a patterned portion of the patterning device based on the measured respective positions of the plurality of reference marks on the patterning device,
      determine a change in a relative position of the edge of the patterned device based on the measured positions of the edge of the patterning device relative to the support provided to hold the patterning device, and
      estimate at least one of the change in a position of the patterning device relative to the support and a change in a pattern distortion of the patterned portion of the patterning device over a time period based on the at least one of the absolute position of the patterned portion and the determined change in the absolute position of the patterned portion and the determined change in the relative position of the edge of the patterning device.

24. The lithographic apparatus of claim 23, wherein the controller is configured to adjust, in real-time, one or more parameters associated with exposure of the target portion of the substrate during the exposure of the substrate in response to a feedback indicative of the estimated change in the pattern distortion.

25. The lithographic apparatus of claim 23, wherein measurement system further comprising:
  a third sensor configured to measure a position of the support provided to hold the patterning device relative to a lens top of the projection system,
  wherein the controller is configured to use the measured position the edge of the patterning device relative to the support and the measured position of the support relative to the lens top to provide a control input to a control loop such that the control input is representative of a position of the patterning device relative to the lens top that defines the position of the patterning device relative to an optical axis of the projection system.

* * * * *